United States Patent

Ng et al.

[11] Patent Number: 5,876,903
[45] Date of Patent: Mar. 2, 1999

[54] VIRTUAL HARD MASK FOR ETCHING

[75] Inventors: Che-Hoo Ng; Bhanwar Singh; Shekhar Pramanick; Subash Gupta, all of Sunnyvale, Calif.

[73] Assignee: Advanced Micro Devices, Sunnyvale, Calif.

[21] Appl. No.: 774,581

[22] Filed: Dec. 31, 1996

[51] Int. Cl.$^6$ .......................................................... G03F 7/26
[52] U.S. Cl. ......................... 430/313; 430/328; 427/523; 438/766
[58] Field of Search ..................................... 430/313, 315, 430/324, 325, 328, 5; 427/523, 526; 438/766

[56] References Cited

U.S. PATENT DOCUMENTS 4,068,018  1/1978  Hashimoto ................................ 427/38

*Primary Examiner*—Kathleen Duda
*Attorney, Agent, or Firm*—David H. Jaffer

[57] ABSTRACT

A method of hardening photoresist (24) by bombardment with ionized particles (42), such as argon. Ionic bombardment causes formation of a hardened skin (22) on the exposed top (30) and side walls (32) of the photoresist (24). The hardened skin erodes at a reduced rate during etching and is less likely to react with products created during etching, thereby allowing etching of more accurate line widths and gaps.

19 Claims, 6 Drawing Sheets

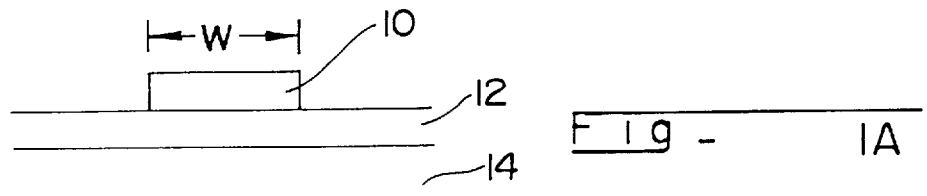
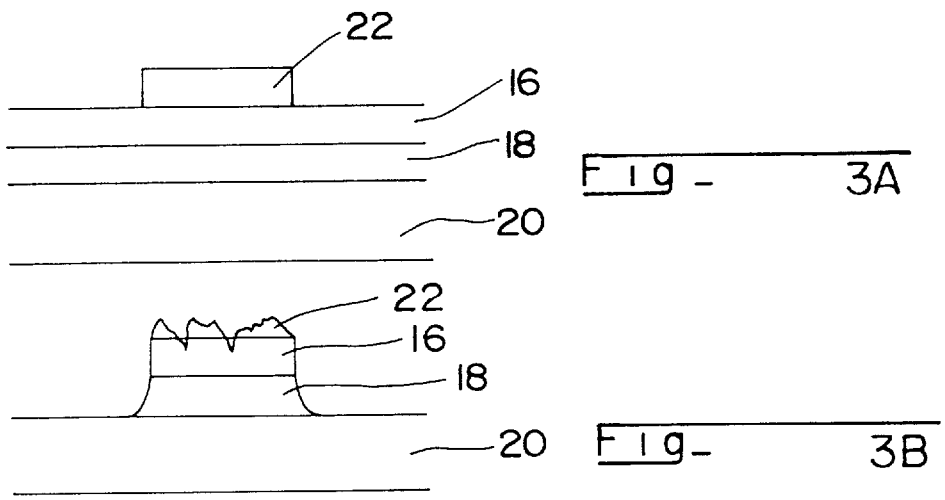
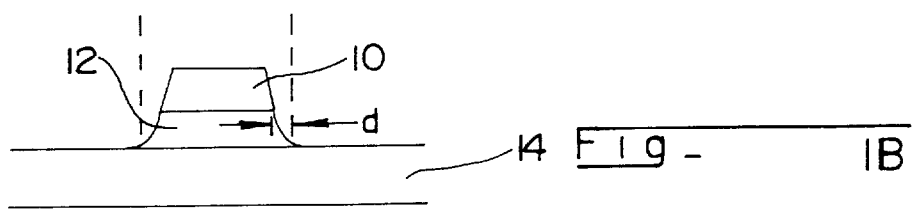

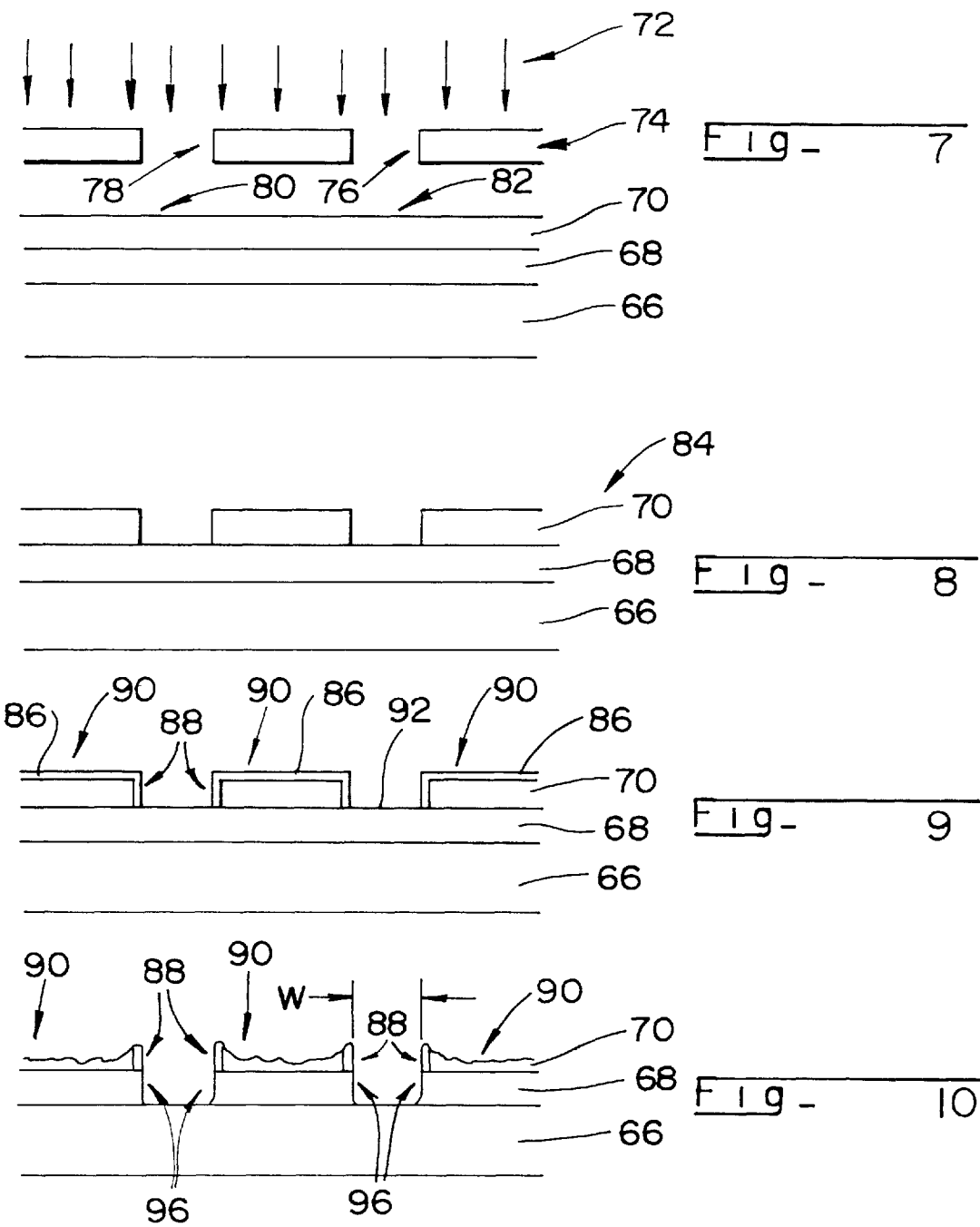

VIRTUAL HARD MASK FOR ETCHING

BACKGROUND OF THE INVENTION

1. Technical Field

The present invention relates generally to photoresists used as a mask for etching purposes, and more particularly to a method of forming a hardened layer on the exposed resist surfaces to slow the rate of erosion during etching procedures.

2. Background Art

The process of accurately etching patterns has been the subject of significant development, particularly in the field of semiconductor electronics. The degree of circuit miniaturization, affecting a product's size and operational frequency limits for example, depend on the degree of accuracy of etching. The process of etching a pattern involves the use of a mask to selectively allow an etchant to remove the semiconductor or conductive material, as required to form the desired pattern. Typically, a mask is formed by spin coating a layer of liquid photoresist on the material to be etched. The desired pattern on the photoresist is then exposed to a form of radiation, for example, through use of an optical mask and ultraviolet light. The exposed areas of the photoresist are rendered either soluble or insoluble to a developer, depending on whether the resist is a positive or negative type. The soluble portions are then removed, and the remaining photoresist functions as a mask for selectively allowing an etchant to remove underlying material in areas void of photoresist protection.

An ideal etchant would not attack the photoresist, or any material underlining the material to be removed, such as semiconductor material below conductive film, or a second semiconductor material under a first semiconductor material. The ideal etchant would also be anisotropic, i.e. etch only straight down into the material to be etched, and not etch laterally. Generally, all purely chemical etchants are isotropic, etching equally in both lateral and vertical directions. This is generally an undesirable characteristic, as illustrated in FIGS. 1a and 1b. FIG. 1a is a simple cross-sectional view of a resist pattern 10 of width w, deposited on a first material 12 to the etched, which is deposited on top of a second material 14. FIG. 1a is before application of an etchant. FIG. 1b shows the resist cross-section 10 reduced in width by 2d. This reduction causes the patterned, etched second material 12 to also be a width less than w by 2d. Actually, FIGS. 1a and 1b ignore the fact that the resist 10 and material to be etched 12, normally etch at different rates. This is a serious problem when isotropic etchants such as chemicals are used, which etch in all directions. The result of using chemical etchants is illustrated in FIGS. 2a and 2b where the resist 16 width w is reduced by 2d1 and the material 18 to be etched is reduced in width by an additional amount 2d2. Since the chemical etchant is isotropic, and designed to attack the material to be etched at a faster rate than the photoresist, a chemical etchant usually undercuts the photoresist to some degree, as shown at 19 in FIG. 2b.

Due to the isotropic nature of chemical etchants, other methods of etching have evolved. One such method is sputtering, which is highly directional, i.e. anisotropic. Unfortunately, this type of etching is not selective, attacking the photoresist as well as the material to be removed and underlying material. Sputtering also causes redeposition of non-volatile species on the side walls of the etched feature. As a result of these problems, this method is not highly successful. An improved method of etching involves a combination of chemical etching, along with impacting the material with energized ions. Regardless of the type of etchant used, the resist is a critical element. Ideally, the resist would be very thin, and would etch very slowly relative to the exposed material to be etched. In order to create a thin, "hard mask", a more complicated process is sometimes used, as shown in FIGS. 3a and 3b, wherein a first layer of hard material 16, such as $Si_3N_4$ is deposited, for example over a $SiO_2$ layer 18 to be etched, which is in turn deposited on a Si substrate 20. A layer of conventional resist 22 is then deposited over the $Si_3N_4$ 16. The objective is to deposit enough resist 22 so that the etchant will erode through the exposed $Si_3N_4$ 16 and $SiO_2$ 18 before the etchant severely erodes the $Si_3N_4$ 16 areas underlying the resist 22. The resultant etched situation before resist 22 and $Si_3N_4$ 16 removal is illustrated in FIG. 3b showing the resist 22 highly eroded, and the $Si_3N_4$ 16 slightly eroded but the $SiO_2$ 18 underlying still intact. Following this etching procedure, the $Si_3N_4$ 16 and resist 22 must be removed. This approach provides some improvement over the other methods discussed, but has the disadvantage of being very complicated.

There is a need for an improved resist material that is less susceptible to erosion by etchants, providing improved accuracy in etching in order to expand the frequency range and reduce dimensions of circuits.

DISCLOSURE OF THE INVENTION

Briefly, a preferred embodiment of the present invention includes a method of hardening photoresist (24) by bombardment with ionized particles (42), such as argon. Ionic bombardment causes formation of a "hardened" (chemically less reactive) skin (22) on the exposed top (30) and side walls (32) of the photoresist (24). Following a conventional etch procedure, the remaining resist material is removed either by plasma ashing and chemical stripping or other conventional methods.

An advantage of the present invention is that it realizes the benefits of a "hard mask" without the processing complexity entailed with a hard mask.

Another advantage of the present invention is that it provides a less chemically reactive or "hardened" resist material that (a) erodes at a reduced rate upon exposure to etchants and (b) is less likely to react with products created during the etching process.

A further advantage of the present invention is that it provides an improved resist material that allows etching of more accurate line widths and gaps, enabling higher frequency performance in electronic circuitry.

A still further advantage of the present invention is that the more accurate etching makes possible the fabrication of smaller, more compact circuitry.

BRIEF DESCRIPTION OF THE DRAWINGS

FIGS. 1a and 1b illustrate the narrowing of etched line widths due to resist erosion using prior art methods;

FIGS. 2a and 2b illustrate prior art cumulative line width narrowing due to resist erosion and undercutting caused by isotropic etchants;

FIGS. 3a and 3b illustrate a prior art use of a resist formed from a thin hard mask layer upon which is deposited a reduced thickness photoresist layer;

FIG. 7 illustrates exposing a photoresist to create a patterned mask;

FIG. 8 shows a resist pattern after development of the exposed resist illustrated in FIG. 7;

FIG. 9 shows the patterned resist after ionic bombardment according to the present invention;

FIG. 10 shows the resist and etched material after application of an etching procedure;

MODE(S) FOR CARRYING OUT THE INVENTION

Figure 4:
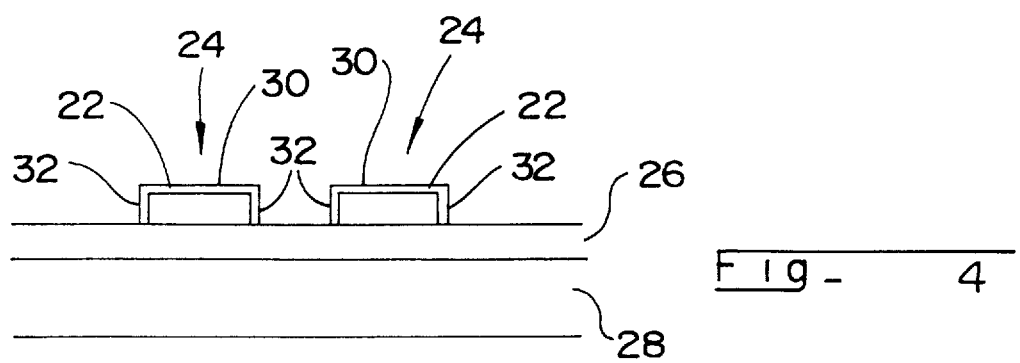
FIG. 4 shows the hardened skin formed on resist, according to the present invention.

Referring now to FIG. 4, the present invention provides a method of forming a hardened layer 22 on a resist material 24, such as photoresist. FIG. 4 is a cross sectional view showing the resist 24 deposited according to a pattern on a first material 26 to be etched, which is deposited on a second material 28. The hardened layer or shell 22 is formed through a process of ion bombardment. Ionic bombardment raises the energy level of the photoresist. We believe that the bombardment breaks chemical bonds in the photoresist material, causing volatile components such as H and OH to be ejected and leaving behind a carbon rich skin, which subsequently crosslinks to yield a "hardened" shell. The hardened shell 22 is formed on the top 30 portions as well as sides 32 of the patterned resist material 24. This hardened shell 22 appears to be less chemically reactive than unhardened photoresist. Consequently, the hardened shell (a) erodes at a reduced rate upon exposure to etchants, and (b) is less likely to react with products created during the etching process (such as "sidewall polymers", which often result during reactive ion etching through reaction of sputtered surface material (e.g. metals or silicon compounds) with photoresist). The reduction in the photoresist etch rate and the reactions which create sidewall polymers improve the accuracy of the final etched pattern in the material 26. With reference to FIGS. 1 and 2, the use of the hardened resist of the present invention would substantially reduce the etched feature errors illustrated as "d" in FIG. 1b and the sum of "d1" and "d2" in FIG. 2b.

Figure 5A:
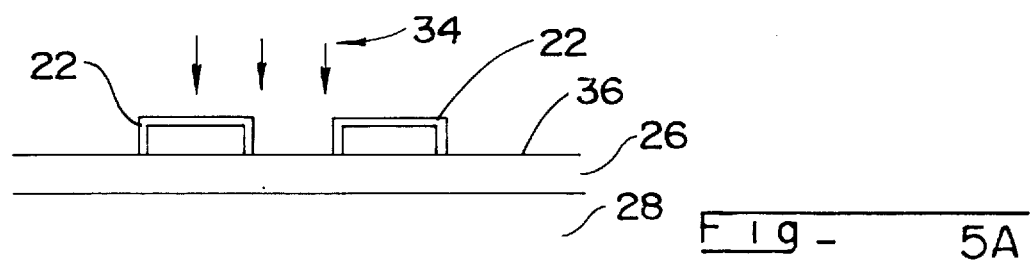
FIGS. 5a and 5b illustrate the present invention as applied with an anisotropic etchant.
Figure 5B:
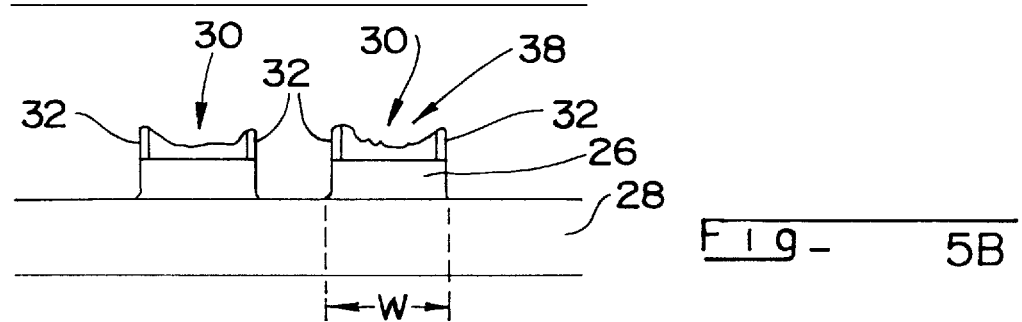

FIGS. 5a and 5b illustrate a typical result when the method of the present invention is used along with an ion assisted plasma etchant 34, with the ions directed normal to the surface 36 of material 26 as illustrated. FIG. 5b shows that due to the highly anisotropic (directional) etchant, and the hardened resist layer 22, the side walls 32 remain relatively uneroded, even though the hardened layer 22 may be eroded away on the top 30, forming a cavity 38. Erosion of the top of the photoresist shell does not matter, as long as at least some of the photoresist remains to protect the underlying layer. The net result of the use of an anisotropic etchant and the hardened resist (which erodes less and is less likely to form sidewall polymers) is a more accurate etched pattern width w of the material 26.

Figure 6:
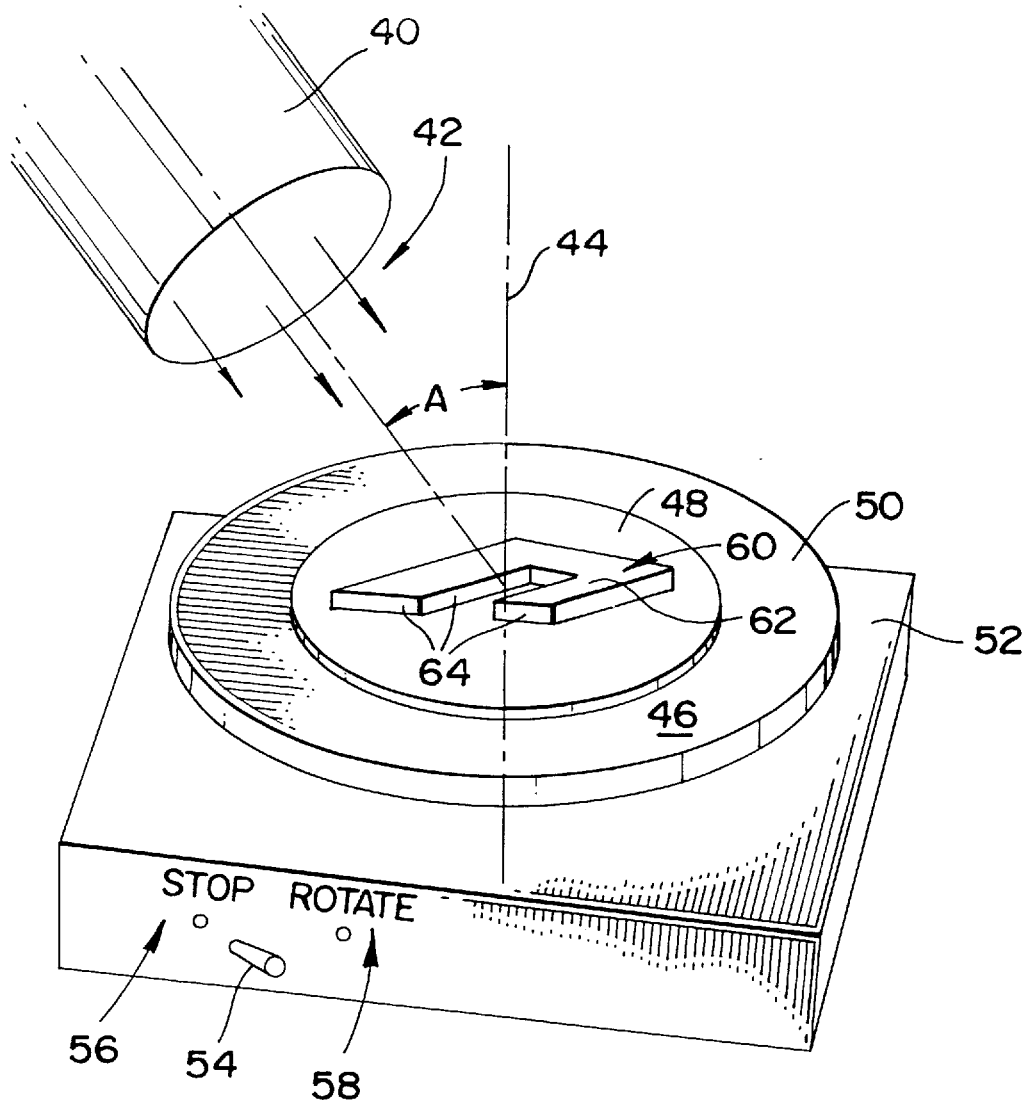
FIG. 6 shows a rotating stage and an ion source in use for treating all of the exposed resist surfaces according to the present invention.

The preferred method of hardening the resist is generally illustrated in FIG. 6. Practical equipment for accomplishing the task is not shown because it will be understood by those skilled in the art after reading the specification of the present invention. FIG. 6 shows a source 40 of accelerated ions 42, oriented at an angle A to an axis 44 aligned perpendicular to the surface 46 of the material/wafer 48 mounted on a rotatable plate 50 of a rotating stage 52. The stage 52 can rotate the plate 50 continuously, or rotate it and stop at a desired degree of rotation. This is symbolically indicated in FIG. 6 by the knob 54 and "rotate" 56 and "stop" 58 marks. For illustration, a resist pattern 60 is shown at an extremely enlargened scale. As the wafer is rotated to various positions throughout a 360 degree rotation, the ions 42 will impact both the top surface 62 and all of the side walls 64 due to the angle A of the ion beam with the axis 44.

Referring now to FIG. 7, the application of the present invention will now be more fully described. For example purposes, FIG. 7 shows a silicon substrate 66 with a silicon dioxide layer 68 to be etched in selected locations. The present invention applies as well to any material to be etched. A specific example follows: A photoresist 70 is spin-coated on the silicon dioxide layer 68. A typical resist would be a commercially available photoresist such as Shipley 511 having an average film thickness of 1 $\mu$m. Optical radiation 72 is then applied to a mask 74, which passes through transmission areas 76 and 78 to illuminate corresponding areas 80 and 82 on the resist 70. The resist is then subjected to an appropriate developing procedure, known to those skilled in the art for removing the exposed areas 80 and 82, assuming a positive resist is used. The wafer is baked at 85° C. in a track oven to dry out the solvent. The result is depicted in FIG. 8. The present invention is not limited to any particular type of resist or method of exposing and developing the resist. The method applies as well to both positive and negative resists.

The resulting substrate assembly 84 of FIG. 8 is then placed on the stage 52 of FIG. 6 and irradiated with (for example) a dose of $10^{15}$ ionized argon atoms per cm$^2$ at an energy of approximately 40 KeV, and at an angle A of 25°–30°. The result is a hardened layer 86 of slightly less than 1 $\mu$m thick, as shown in FIG. 9. As noted in the description of FIG. 6, the assembly 84 is rotated in order to irradiate all of the side walls, such as 88 shown in FIG. 9, as well as the top surfaces 90. The angle "A" of the beam 42 (FIG. 6) of argon is preferably about 25 degrees with the axis 44 perpendicular to the surface 92 of layer 68 and surfaces 90 of the resist.

The process has been discussed above with reference to specific conditions. In practice, a "hardening" of photoresist will occur with ion irradiation at any angle, but results will be more uniform with irradiation at an angle A of from 5 degrees to 60 degrees, preferably 10 degrees to 45 degrees, and most preferably 20 degrees to 35 degrees. Ion doses in the range of $10^{12}$ to $10^{17}$ ions/cm$^2$ are acceptable, most preferably in the range of $10^{15}$ to $10^{16}$. Ion energies of at least 1 KeV are used, preferably in the range of 10–300 KeV, and most preferably in the range of 20–100 KeV. Any ion can be used to energize the photoresist. However, species which will not chemically react with the photoresist (such as inert gases like the noble gases and nitrogen) are preferred. The most preferred species are argon and nitrogen, because of their low reactivity and low cost.

The process of ion bombardment forms the hardened shell 86 on the top and sides of the resist as shown in FIG. 9. The assembly 94 with hardened resist is then subjected to an etching procedure. Any wet or dry etchant, isotropic or anisotropic can be used at this point, and the result will be a more accurate etch due to the hardened (non-reactive)

resist. The particular etchant chosen will depend on the etching profile desired. For example, if conductive lines designed to carry current are to be etched, steep walled profiles are preferred. In the case where the etched walls are to be covered with a subsequent deposit, a sloping profile allows better coverage. An etchant that provides steep, accurate walls, for example, would be an ion assisted plasma etchant, which provides a fair degree of anisotropy. Since the top surfaces of the resist are subject to direct bombardment of the ions and the thickness of the hardened shell is less than the height of the hardened side walls, they etch faster than the side walls. A typical profile of the resist subsequent to etching would look somewhat like that shown in FIG. 10, with the hardened surface etched away at the top 90, and the side walls 88 less affected. The etched silicon dioxide walls 96 are indicated in FIG. 10 to be relatively straight with minimal reduction in width w, showing a significant improvement over results obtained using conventional, prior art resist materials and processes.

Figure 11:
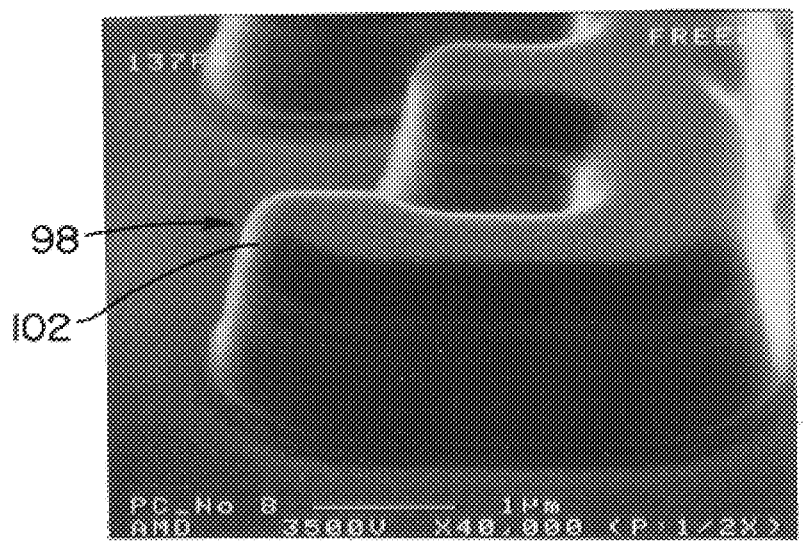
FIG. 11 is a photo illustrating a prior art resist after an etching procedure.
Figure 12:
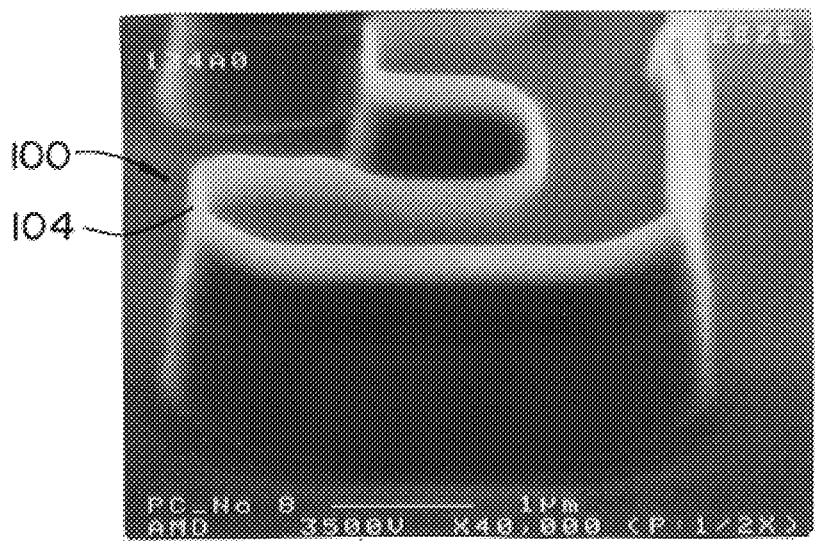
FIG. 12 is a photo illustrating the hardened resist side walls of the present invention subsequent to etching.

FIG. 11 is a photo showing the shape of a normal resist 98 subsequent to etching. FIG. 12 shows the resist 100 of the present invention after etching. Referring again to FIG. 11, note the curved side walls 102 of the normal resist. Compare this with the steep, uneroded hardened wall edges 104 in FIG. 12.

Figure 13:
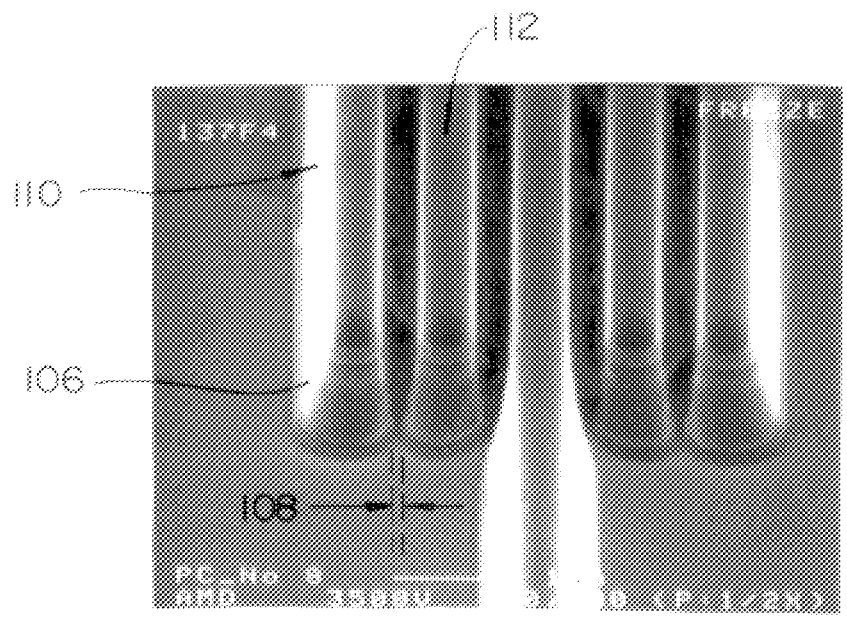
FIG. 13 is a photo showing etched lines using a prior art method.
Figure 14:
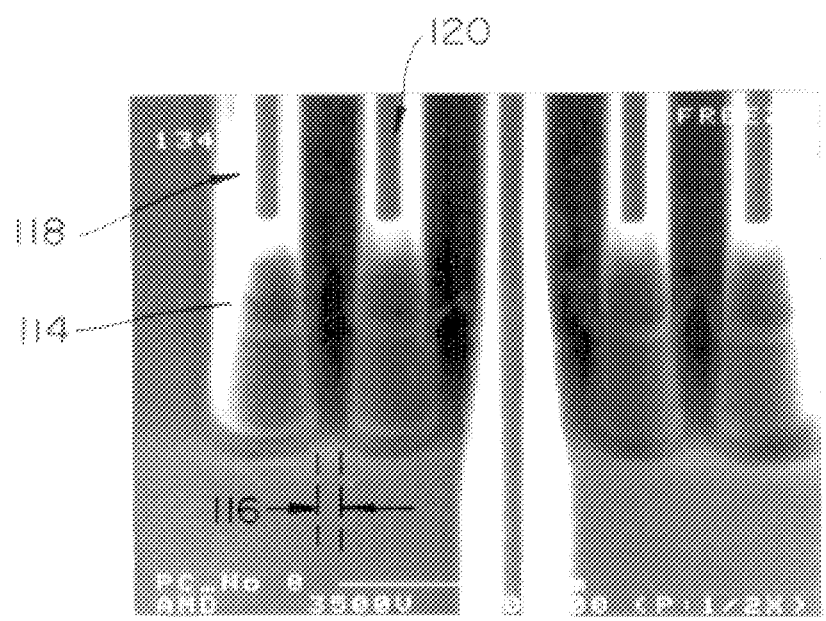
FIG. 14 is a photo showing etched lines using the hardened resist of the present invention.

FIGS. 13 and 14 further illustrate the improvement provided by the hardened resist of the present invention. FIG. 13 illustrates the result of a prior art method. Note the shape of the etched walls 106 of the etched material ($SiO_2$) and the distance 108 between adjacent lines 110 and 112 of etched $SiO_2$. FIG. 14 illustrates the result using the hardened resist of the present invention. The walls 114 in FIG. 14 are steeper, and the spacing 116 between adjacent lines 118 and 120 is greater than the result of the prior art shown in FIG. 13. This improvement translates into a significant performance advantage in both size and frequency of operation of semiconductor devices.

Following the etching procedure, it is necessary to remove the resist material. In the preferred embodiment, the resist is treated by oxygen plasma ashing, followed by chemical stripping. The details of such a procedure are known to those skilled in the art, and alternatives such as acids may also be used. In cases when the resist is particularly difficult to remove, the resist can be softened by first applying a heated forming gas (4% $H_2$ in nitrogen) prior to the oxygen plasma ashing and chemical stripping. We believe this "softening" is the result of adding hydrogen to the hardened photoresist, which reduces cross-linking of carbon in the photoresist ("reverse carbonizes" the photoresist).

Although the present invention has been described in terms of a preferred embodiment, variations will be apparent to those skilled in the art. It is therefore intended that the following claims be interpreted so as to include such variations.

Industrial Applicability

The present invention has industrial applicability in a number of areas. Due to the current state of the art of semiconductors in computer applications, the hardened resist is of great significance in this field. Its use will allow smaller structures and faster operating speeds. All other areas of electronic technology, in which etching procedures are performed, can also benefit from the more accurate results generated through use of the hardened photoresist of the present invention. Specific applications include printed circuit board production and microwave circuitry.

What is claimed is:

1. A method for processing a semiconductor wafer comprising the steps of:
    a) applying photoresist to a surface of the wafer;
    b) patterning the photoresist to create a patterned resist having side walls and top surfaces;
    c) hardening the patterned photoresist by bombarding the photoresist with ions having at least 1 KeV energy, directing said ions from a source at an angle greater than zero to a perpendicular to the surface; and
    d) rotating the surface relative to the source so that the bombardment occurs from different positions relative to the surface, whereby the directing and rotating cause the ions to impact the side walls as well as the top surfaces.

2. A method as recited in claim 1 wherein said ions are a selected species which will not chemically react with said photoresist.

3. A method as recited in claim 2 wherein said ions are created from gases selected from the group consisting of inert gases.

4. A method as recited in claim 3 wherein said ions are created from gases selected from the group consisting of noble gases and nitrogen.

5. A method as recited in claim 4 wherein said ions are created from gases selected from the group consisting of argon and nitrogen.

6. A method as recited in claim 1 wherein said angle is in the range of 5 to 60 degrees.

7. A method as recited in claim 6 wherein said angle is in the range of 10 to 45 degrees.

8. A method as recited in claim 7 wherein said angle is in the range of 20 to 35 degrees.

9. The method of claim 1, further comprising the step of anisotropically etching the surface of the wafer after the hardening step, whereby the hardened patterned photoresist improves the accuracy of the final etched pattern on the substrate.

10. A method as recited in claim 9 wherein said ions are a selected species which will not chemically react with said photoresist.

11. A method as recited in claim 10 wherein said ions are created from gases selected from the group consisting of inert gases.

12. A method as recited in claim 11 wherein said ions are created from gases selected from the group consisting of noble gases and nitrogen.

13. A method as recited in claim 12 wherein said ions are created from gases selected from the group consisting of argon and nitrogen.

14. A method as recited in claim 9 wherein said angle is in the range of 5 to 60 degrees.

15. A method as recited in claim 14 wherein said angle is in the range of 10 to 45 degrees.

16. A method as recited in claim 15 wherein said angle is in the range of 20 to 35 degrees.

17. A method as recited in claim 10 wherein said angle is in the range of 5 to 60 degrees.

18. A method as recited in claim 17 wherein said angle is in the range of 10 to 45 degrees.

19. A method as recited in claim 18 wherein said angle is in the range of 20 to 35 degrees.

* * * * *